(12) United States Patent
Jacobs et al.

(10) Patent No.: US 8,184,445 B2
(45) Date of Patent: May 22, 2012

(54) MODULAR ELECTRIC SYSTEM

(75) Inventors: Joseph Hendrik Anna Maria Jacobs, Eygelshoven (NL); Dirk Hente, Wuerselen (DE); Eberhard Waffenschmidt, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 134 days.

(21) Appl. No.: 12/525,940

(22) PCT Filed: Feb. 7, 2008

(86) PCT No.: PCT/IB2008/050442
§ 371 (c)(1),
(2), (4) Date: May 10, 2010

(87) PCT Pub. No.: WO2008/099306
PCT Pub. Date: Aug. 21, 2008

(65) Prior Publication Data
US 2010/0214747 A1    Aug. 26, 2010

(30) Foreign Application Priority Data

Feb. 12, 2007 (EP) .................................... 07102169
May 4, 2007 (EP) .................................... 07107498
Jun. 4, 2007 (EP) .................................... 07109497

(51) Int. Cl.
*H05K 7/00* (2006.01)
(52) U.S. Cl. ........ 361/760; 361/601; 361/622; 361/725; 361/731
(58) Field of Classification Search .................. 361/760, 361/601, 622, 681, 725, 731
See application file for complete search history.

(56) References Cited

U.S. PATENT DOCUMENTS

| 4,752,756 A | 6/1988 | Bartel |
| 6,788,541 B1 | 9/2004 | Hsiung |
| 2006/0002110 A1 | 1/2006 | Dowling et al. |

FOREIGN PATENT DOCUMENTS

| DE | 19820104 A1 | 11/1999 |
| DE | 10044356 C1 | 6/2002 |
| EP | 1733653 A2 | 12/2006 |
| FR | 2836985 A1 | 9/2003 |
| JP | 2006164827 A | 6/2006 |
| WO | 0125686 A1 | 4/2001 |
| WO | 2004094896 A2 | 11/2004 |
| WO | 2006077498 A1 | 7/2006 |
| WO | 2008099305 A1 | 8/2008 |

*Primary Examiner* — Xiaoliang Chen
(74) *Attorney, Agent, or Firm* — Mark L. Beloborodov

(57) ABSTRACT

The present invention relates to a modular electric system with a base module (2, 11) comprising a substrate (3, 12), a power supply (40), power/data transmission means (4, 16) and holding means; at least one load module (7, 20, 30) comprising an cc electric load, a power/data receiving means (8, 26) and a holding means, said load module (7, 20, 30) being adapted to be placeable on said substrate (3, 12) in first and second positions, wherein in said first position (connecting position) the transmission means (4, 16) of said base module interact with said receiving means (8, 26) of said load module (7, 20, 30) and in said second position (repelling position) interaction of said transmission means (4, 16) and said receiving means (26) is not allowed or possible. The modular electric system is characterized in that said holding means of said base module and said load module comprise magnet elements (5, 9, 49, 59) which are arranged relative to each other such that the load module (7, 20, 30) is removably held in said first position and is not held in said second position.

9 Claims, 4 Drawing Sheets

MODULAR ELECTRIC SYSTEM

FIELD OF THE INVENTION

The present invention relates to a modular electric system with a base module comprising a substrate, a power supply, power/data transmission means and holding means; at least one load module comprising an electric load, a power/data receiving means and a holding means, said load module being adapted to be placeable on said substrate in first and second positions, wherein in said first position the transmission means of said base module interact with said receiving means of said load module and in said second position interaction of said transmission means and said receiving means is not allowed or possible.

BACKGROUND OF THE INVENTION

In many applications, it is desired that products are scaleable. This means that the products consist of multiple parts, some or all of which are removable. For correct positioning, mechanical connectors, such as screws, tags or snap-on connections are required. These connectors, however, encounter several problems. For example, snap-on connections wear out with time, so that they have a limited lifetime, particularly if used frequently. Further, they are visible if the parts are removed, leaving an ugly view.

In addition thereto, with the continuous electrification of modern products, also the electrical power supply and data transmission have to be scaleable. This requires electrical contacts between the parts of the product. In most cases standard connectors are used, which, however, are bulky and also visible, which decreases the beauty of the system and limits the scope of the design possibilities.

Further with the increase in electrical contacts between the parts of the system, the risk of wrong connections between the parts increases and hence the risk of damage due to e.g. short circuits. In order to avoid severe damage due to wrong connections, the parts are provided with safety circuits. These measures, however, increase costs.

SUMMARY OF THE INVENTION

In view of the above, it is therefore an object of the present invention to design the above mentioned modular electric system such that the disadvantages are overcome. Particularly, the modular electric system must allow that the load modules may be removably placeable on the base module easily and without the risk of wrong connections between the base module and the load module.

This and other objects of the present invention are solved by the above mentioned modular electric system which is characterized in that said holding means of said base module and said load module comprise magnet elements which are arranged relative to each other such that the load module is removably held in said first position and is not held in said second position.

In the context of this application, "arranged" means the positioning of the magnet elements on the base module and the load module as well as the orientation of the polarization (north/south pole) of the magnet elements.

In other words, the base module and the load module are equipped with magnet elements which serve on the one hand to hold the load module on the base module and on the other hand to guarantee a correct positioning with respect to the connections between the two modules for supplying power and/or transmitting data.

Since the magnet elements may be embedded in the substrate or frame of the modules, the view and design of the whole system is not negatively affected. Moreover, magnet elements are not susceptible to wear, hence their lifetime is not limited compared to mechanical elements.

The inventive modular electric system may be used in different applications, such as carpets, lamps, games, presence registration or security.

In a preferred embodiment, said electric load is a light unit and/or a controller unit. More preferably, said light unit comprises at least one OLED (organic light emitting diode) and/or LED (light emitting diode).

In a further preferred embodiment, said power/data transmission means comprises at least two electrodes, and said power/data receiving means comprises at least two electrode connector elements. Of course, it is also conceivable that said power/data transmission means comprises at least two electrode connector elements, and said power/data receiving means comprises at least two electrodes.

Although the supply of power to the load module and the transmission of data between the modules may be carried out wirelessly, which is a very elegant and flexible solution, the connections via conducting elements are the most inexpensive way and hence employed in many applications, particularly in the field of lighting systems. Here, the base module comprises electrodes which are contacted by electrode connector elements of the load modules.

In a preferred embodiment, said holding means of said base module comprises at least two magnet elements with similar orientation of polarization, and said holding means of said load module comprises at least two magnet elements with similar orientation of polarization. Preferably, the magnet elements of said base module and said load module are oriented with respect to polarization such that in the second position at least one magnet element of said base module repels an adjacent magnet element of said load module.

In other words, the magnet elements of said base module and said load modules are arranged such that the user "feels" the right and wrong positions of the load module on the base module. The user gets a tactile feedback about the possibilities how to place the load modules on the base module.

The use of the attracting and repelling forces of magnet elements opens a variety of possibilities to position load modules on the base module. E.g. it is conceivable that different load modules have differently oriented magnet elements allowing to provide different positions for these load modules on the base module. For example, it would be possible to provide certain places on the substrate for load modules with controllers and certain positions for load modules with light units.

In a further preferred embodiment, said holding means of said load module comprises an arrangement of four magnet elements arranged in four corners of a frame of said load module, and said holding means of said base module comprises at least one arrangement of four magnet elements arranged similarly to said load module arrangement. Preferably, said holding means of said base module comprises a plurality of arrangements of four elements evenly distributed on the substrate.

This measure has the advantage that the provision of such arrangements allows to define specific positions for load modules precisely.

In a further preferred embodiment, two adjacent magnet elements of said arrangement of said base module and said load module are oriented different from the other two magnet elements.

This measure has the advantage, that the position of the load module on the base module may further be limited. Particularly, the load module may be placed only in one angular position.

In a further preferred embodiment, said base module and/or said load module comprise at least one of the following members: a converter for converting the supply voltage and/or current to a different voltage or current, an analog control circuitry, a digital control circuitry, a turn-on/off switch, a protection circuit. The protection circuit is an auxiliary electronic element that protects the main part, e.g. overvoltage protection, short-circuit protection, overtemperature protection, etc. More preferably, at least two electrodes are provided on said substrate in the form of elongated parallel conductor lines, and said load module comprises at least two electrode connector elements spaced apart according to the spacing of said conductor lines.

In a further preferred embodiment, at least one of said magnet elements is provided as a magnetic strip. The design of the strip may be selected according to the application, e.g. parallel or circular magnetic strip arrangements are possible.

Hence, this measure has the advantage that the form/design of the magnet elements is very flexible and may be adapted to many applications. Also, magnetic strips as magnet elements are very cost effective.

Further advantages will become apparent from the description and the enclosed drawing.

It goes without saying that the features mentioned above and those that will be explained hereinafter may not only be used in the particularly given combination but also in other combinations or alone without leaving the scope of the present invention.

Embodiments of the invention are depicted in the drawings and will be explained in further detail in the subsequent description.

DETAILED DESCRIPTION OF EMBODIMENTS

Figure 1:
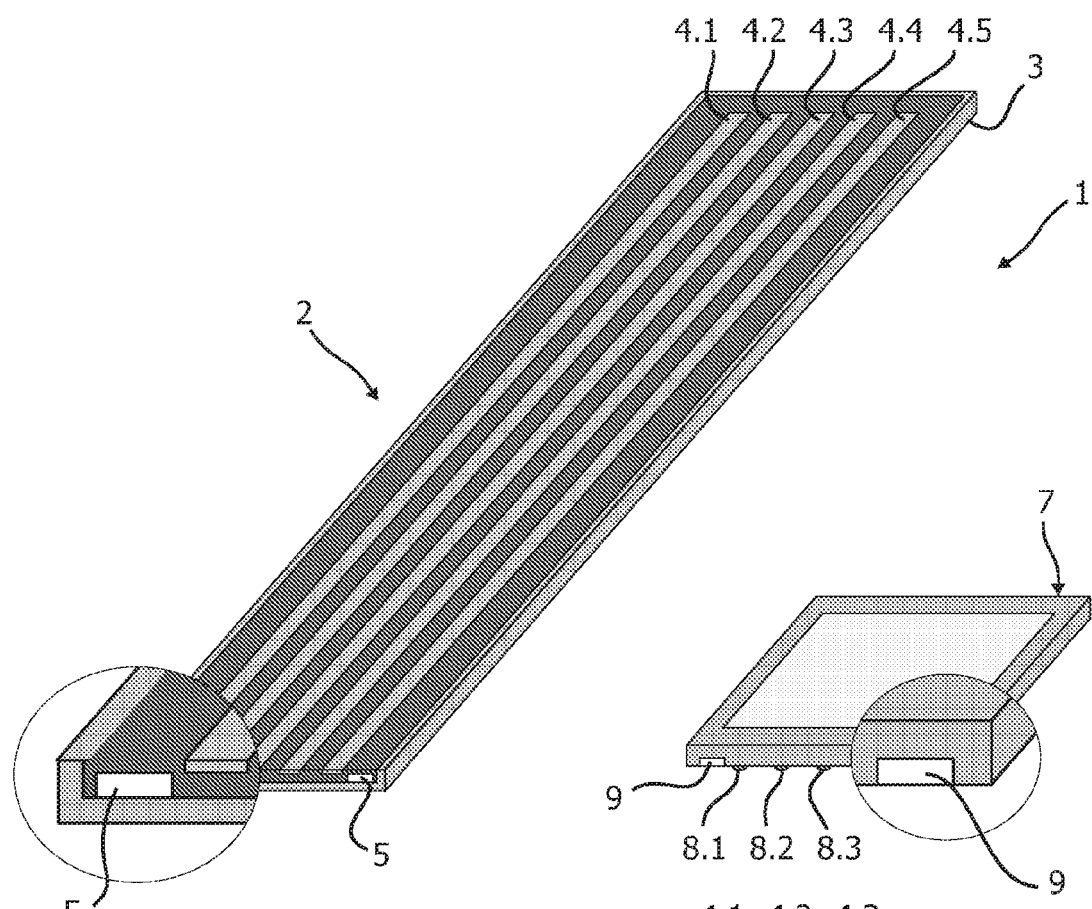
FIG. 1 shows a schematic perspective view of a modular electric system according to the invention.

In FIG. 1, a modular electric system is schematically shown and indicated with reference numeral 1. The system comprises a base module 2, which forms the fixed part of the system, and at least one load module 7, which forms the freely placeable and removable part of the system. The base module 2 comprises a base plate 3, which may be provided as a substrate carried by a frame. The substrate, which may e.g. include a printed circuit board and/or an assembly of several layers made of the same or different materials and shapes, comprises at least two electrodes, e.g. in the form of elongated parallel conductor lines extending along the whole length of the substrate. The substrate may also consist of multiple parts, such as case, mounting fixtures, mechanical stabilizers, etc. The electrodes, which are indicated with reference numerals 4.1-4.5 in FIG. 1, are provided to supply power to the load modules and to transmit data between the base module and the load modules.

Further the base module comprises magnet elements 5 (hereinafter called "magnets") which are preferably embedded in the substrate so that they are not visible. Generally, the magnets 5 serve as holding and positioning means for the load modules 7. The magnets 5 may e.g. be formed as elongated stripes extending along the whole length of the base module. They may, however, also be provided as non-continuous stripe portions distributed along the length of the base module. It is also conceivable that the base module comprises only a single magnet 5. Some examples of form/shape, position and orientation of the magnets 5 will be described in more detail hereinafter.

The load module 7 carries at least one electrical consumer or load (not shown), such as a control circuit or a light unit, just to mention two examples. The electric power for supply to the load is transmitted from the base module via electrode connector elements 8 which are mounted on the bottom side of the load module. In the correct position on the base module, the connector elements 8 get in contact with respective electrodes, so that an electric connection is built up.

The load module 7 comprises at least two connector elements 8.1, 8.2 for receiving a supply voltage. In applications where data (like control signals, etc.) have to be transmitted, at least one further connector element 8.3 is provided. In FIG. 1, the base module comprises three connector elements 8.1-8.3. However, it is also conceivable that the control signals are transmitted via the electrodes intended for supplying power. This allows to design the substrate and the load modules only with two electrodes and respective connectors.

In order to fix the load module on the base module, at least one magnet 9 is provided on the bottom side of the load module. Preferably, two or more magnets 9 are provided. The arrangement (orientation and position) of the magnets of the load module is dependent on the position and orientation of the magnets 5 of the base module 2. The interaction of the magnets 5 of the base module and the magnets 9 of the load module has to guarantee that the connector elements 8.1-8.3 contact the appropriate electrodes 4 of the base module. With respect to FIG. 2, the connector elements 8.1-8.3 have to contact electrodes 4.1, 4.2 and 4.3, respectively. According thereto, the spacing between the magnets 9 of the load module corresponds to that of the magnets 5 of the base module 2. Hence, the magnets 5, 9 prevent the load module from being connected incorrectly, e.g. that it is placed and held on the base module with e.g. connector element 8.1 contacting electrode 4.2, etc.

Figure 2:
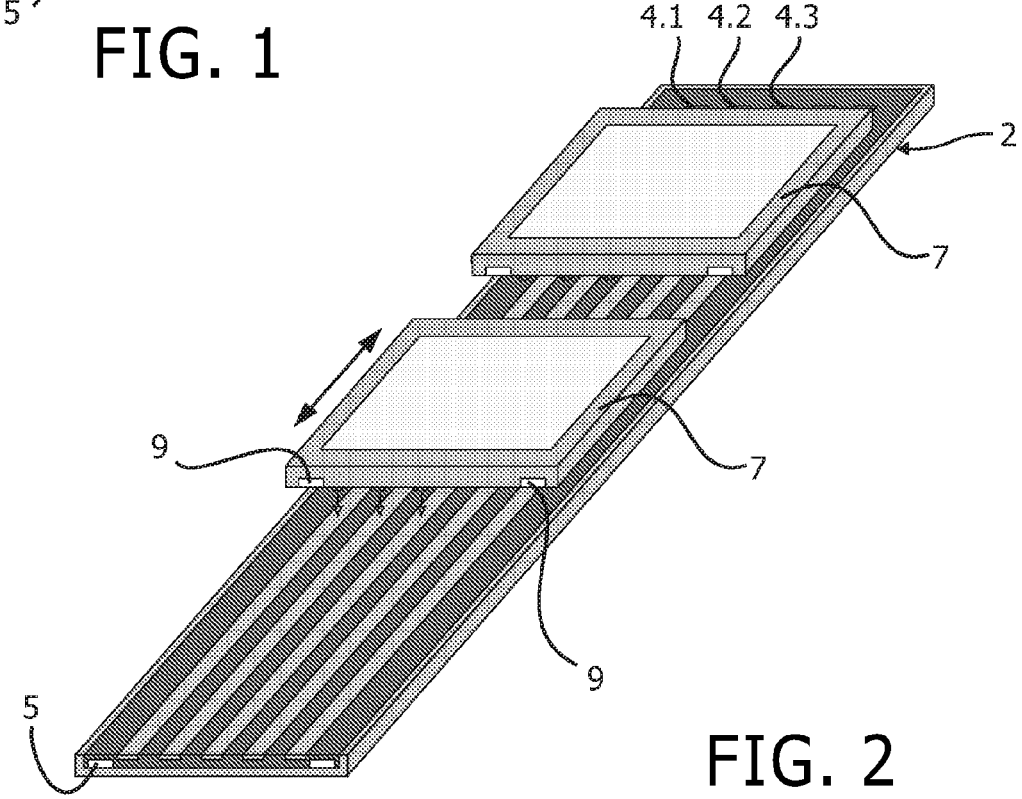
FIG. 2 shows a schematic perspective view of a modular electric system with two load modules on the base module.

By the usage of magnets as holding means, the load modules 7 are removable and may be freely placed in a longitudinal direction of the base module as indicated by the arrow in FIG. 2.

The above mentioned modular electric system may be used generally for positioning removable parts and their electric contacts, respectively, on a fixed part. However, the modular system is preferably used for a modular lighting system as for example disclosed in applicant's application EP 07102169 (PH0007411EP1), the disclosure of which is herewith incorporated by reference.

Figure 3:
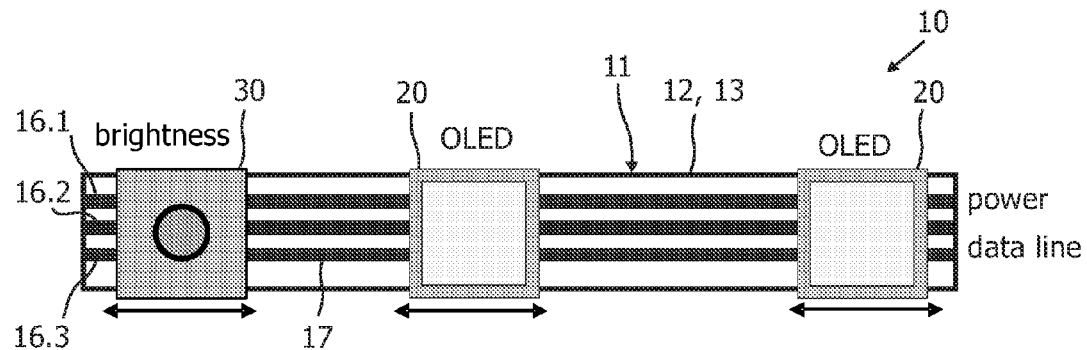
FIG. 3 shows a schematic view of a modular electric system provided as a lighting system with light modules.
Figure 3:
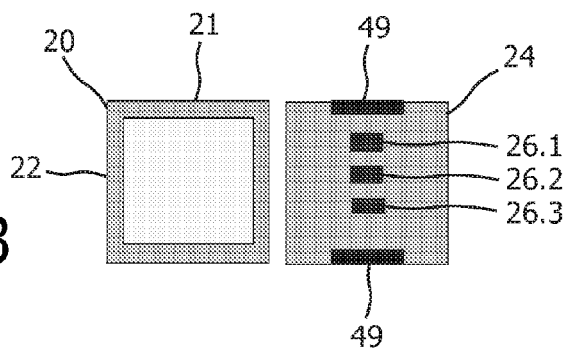

In FIG. 3 a modular electric system in the form of a lighting system is schematically shown with its main parts and is referenced with reference numeral 10. The lighting system generally serves to emit light, for example to illuminate a room, etc.

The lighting system 10 comprises as the base module a base module 11, and as load modules one or more light modules 20 and a control module 30.

The base module 11 comprises a substrate 12, for example a printed circuit board 13 and at least two, preferably three, electrodes 16.1 to 16.3. In the example shown in FIG. 3, the electrodes 16.1 to 16.3 are printed circuit board conductor lines 17 which extend parallel to each other and in a straight line. In the context of the present invention, "parallel" means that the electrodes 16 are placed in such a way that the distance between them does not change over their complete length. Parallel, however, does not mean that the electrodes have to extend along a straight line. The electrodes may also be provided as concentrical circles or rings as it will be described later.

Two of the electrodes 16.1, 16.2 are used for supplying power and the third electrode 16.3 is used as a data line provided that one electrode is used as common ground for power transfer and data transfer. Of course it would also be possible to provide two electrodes as data lines. The length of the base module, particularly the substrate 12, may be freely selected dependent on the specific application of the lighting system.

The light module 20 comprises a frame 21, for example in a rectangular design, supporting a substrate on which at least one light element 42 is provided. The light element 42 may be an organic light emitting diode (OLED) as in the present embodiment, or any other electrically powered light element, such as light emitting diodes, halogen lamps, etc.

The light element 42 is provided on the front side 22 of the frame 21, whereas the back side 24 carries at least two, preferably three, electrode connector elements 26.1 to 26.3. The electrode connector elements are provided, for example, as flat electrode pads or connector pins dependent on the application. The electrode connector elements 26 have to be adapted to the electrodes 16, particularly in terms of their spatial position and their size. The electrode connector elements 26 have to contact the respective electrodes 16 when properly positioned on the substrate 12.

The light module 20 also comprises holding members 49 which are designed to engage the substrate 12 as to hold and fix the light module 20 on the substrate 12.

The control module 30 has a back side which is similar to the back side of the light module 20, meaning that it comprises electrode connector elements and magnets 49 serving as holding means. The front side of the control module 30 supports a rotary switch which can be manually operated by the user.

In operation, the electrodes 16.1 and 16.2 of the base module 11 are supplied with a supply voltage, which is received by the control and light modules 30, 20 via the electrode connector elements 26.1 and 26.2. The supply voltage is used to power the light elements of the light modules 20 and a controller circuit on the control module 30.

Via the third electrode 16.3, the control module 30 transmits parameter signals dependent on the operation of the rotary switch 34, which parameter signals are received by the light modules 20 and are used to adjust the light elements according to the desired parameter. Brightness and color of the light elements may be such parameters.

Hence, the control module 30 attached to the base module 11 allows to control the light modules 20 also attached to the base module 11. Preferably, the light modules 20 may be addressed and hence controlled by the control module individually. Further, the control module 30 may be adapted to control the supply voltage by transmitting signals to an input converter which in turn adapts the supply voltage.

As indicated by the arrows in FIG. 3, the light modules as well as the control module are first freely movable along the length of the substrate 12 (that runs parallel to the electrodes 16) and second are freely removable from the substrate by overcoming the attracting force of the magnets 49 interacting with magnets (not shown in FIG. 3) of the base module 11. These magnets may be provided e.g. as two parallel stripes extending along the whole length of the base module 11, wherein the spacing of the two stripes corresponds to the spacing of both magnets 49 of the light and control modules 20, 30.

Hence, the lighting system is very flexible with respect to the positions of the light modules, and is easy to control by using the control module 30, which can also be attached to the substrate 12 at any position along the length of the substrate.

As already mentioned above, the control module generates and transmits a control signal via electrode 16.3, which signal represents a desired light parameter (brightness and/or color). This control signal may be received by any light module 20 attached to the substrate 12 and may be used to adjust the light element accordingly.

Figure 4:
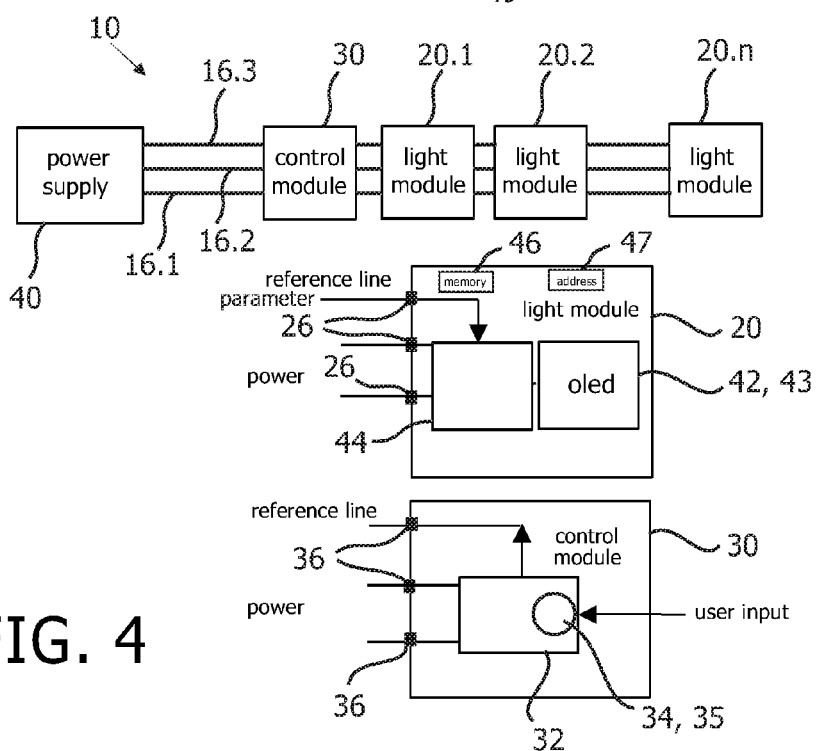
FIG. 4 is a schematic block diagram showing the components of a light module and a control module and the whole lighting system.

In FIG. 4, a schematic block diagram of the components of the lighting system 10 as well as the main circuit components of the light module and the control module are shown. However, it is to be noted that these block diagrams only show the main circuit parts and not every circuit necessary for achieving the described functions. A skilled person knows how to design the circuitry so as to achieve the mentioned functions.

The lighting system 10 as shown in FIG. 4 comprises at least three electrodes 16 connecting a control module 30 and several light modules 20.1 to 20.n. The supply voltage electrodes 16.1, 16.2 are electrically coupled with a power supply unit 40 which may be part of the lighting system 10 or which may be an external unit. The power supply unit 40 may be for example an AC/DC converter with an output voltage of 12 V. However, other voltages may also be possible depending on the application. The power supply unit may also comprise protection circuitry, such as overvoltage protection, short-circuit protection, over-temperature protection, etc.

The light module 20 comprises three electrode connector elements 26, two of which are electrically coupled with a power supply converter/controller circuit 44. This circuit 44 powers a light element 42, which may be provided as an organic light emitting diode (OLED) 43.

Further, the light module 20 comprises a memory 46 for storing at least one parameter value transmitted by the control module 30. Optionally, a further memory 47 may be provided for storing address data. As will be described below, this memory opens the possibility of addressing each individual light module via the control module.

As already mentioned in the above, the memory 47 may be provided in the form of an electronic memory, such as an EPROM, EEPROM, etc., or in the form of a mechanical memory, such as a DIP-switch, etc.

The control module 30 comprises a controller circuit 32 which is electrically coupled with the electrode connector elements 36. Further, the control module 30 has a controller element 34 which is, for example, a rotary switch 35.

The controller circuit 32 is powered via the power supply electrodes 16.1, 16.2 and generates control signals carrying a parameter which represents the brightness or color value given by the user by operating the rotary switch 35. This control signal is transmitted via the third electrode 16.3 and is received by the controller circuit 44 of the light modules 20. Further, the transmitted parameter value is stored in the memory 46. Beside the brightness or color parameter, the control module 30 may also transmit a signal representing an instruction for the light modules 20 to switch on or off.

It is to be noted that the control signals may also be superposed on the supply voltage with the result that the third electrode/connector may be omitted.

Both the light module 20 and the control module 30 may also comprise protection circuitry, such as overvoltage protection, short-circuit protection, over-temperature protection, etc.

As already mentioned above, the light modules 20 as well as the control module 30 can make a translatory movement along the length of the substrate 12, as indicated by the arrows shown in FIG. 3. Hence, the light modules as well as the control module 30 are almost freely placeable with the advantage that the control module 30 may be placed at a position allowing a convenient operation of the operating element 34 by the user.

As already mentioned above, in a preferred embodiment, the light modules may comprise an address memory 47 allowing to transmit control signals to individual light modules. Each light module 20 has its own address stored in the address memory 47—either set automatically or manually. The address is unique to each module 20 and allows the independent control of the individual light modules independently of each other. The address is preset by the manufacturer and can be modified by the user of the light system. The addresses may also be used to build groups of light modules which can be controlled independently by the controller. A group comprises one or more light modules 20.

A communication protocol for the control data ensures the communication between the light modules 20 and the control module 30. Such kind of communication protocol can be a standard one, e.g. DALI; DMX or a proprietary one.

Optionally, the control module 30 has an interface to an external host computer. The host computer might be used for easy set up of the lighting system.

The light and control modules shown in FIG. 3 have three connector elements 26.1-26.3 which have to contact the appropriate electrodes or conductor lines 16.1-16.3. To guarantee the correct position, the spacing of the magnets 49 of the light or control module corresponds to that of the magnets of the base module which extend parallel to each other and the conductor lines 16. Hence the attracting force of the magnets position the light/control modules 20, 30 so that the connector elements 26 contact the conductor lines 16.

Further, to prevent the connector element 26.3 from contacting electrode 16.1, the orientation of the magnets of the base module 11 and the light/control module 20, 30 is different. In other words, one magnet 49 of the light/control module 20, 30 has its north pole on the bottom side and the other magnet has its north pole on the top side. The different orientation of the magnets allows to use the repelling force of the magnets to indicate the wrong position to the user.

Figure 5:
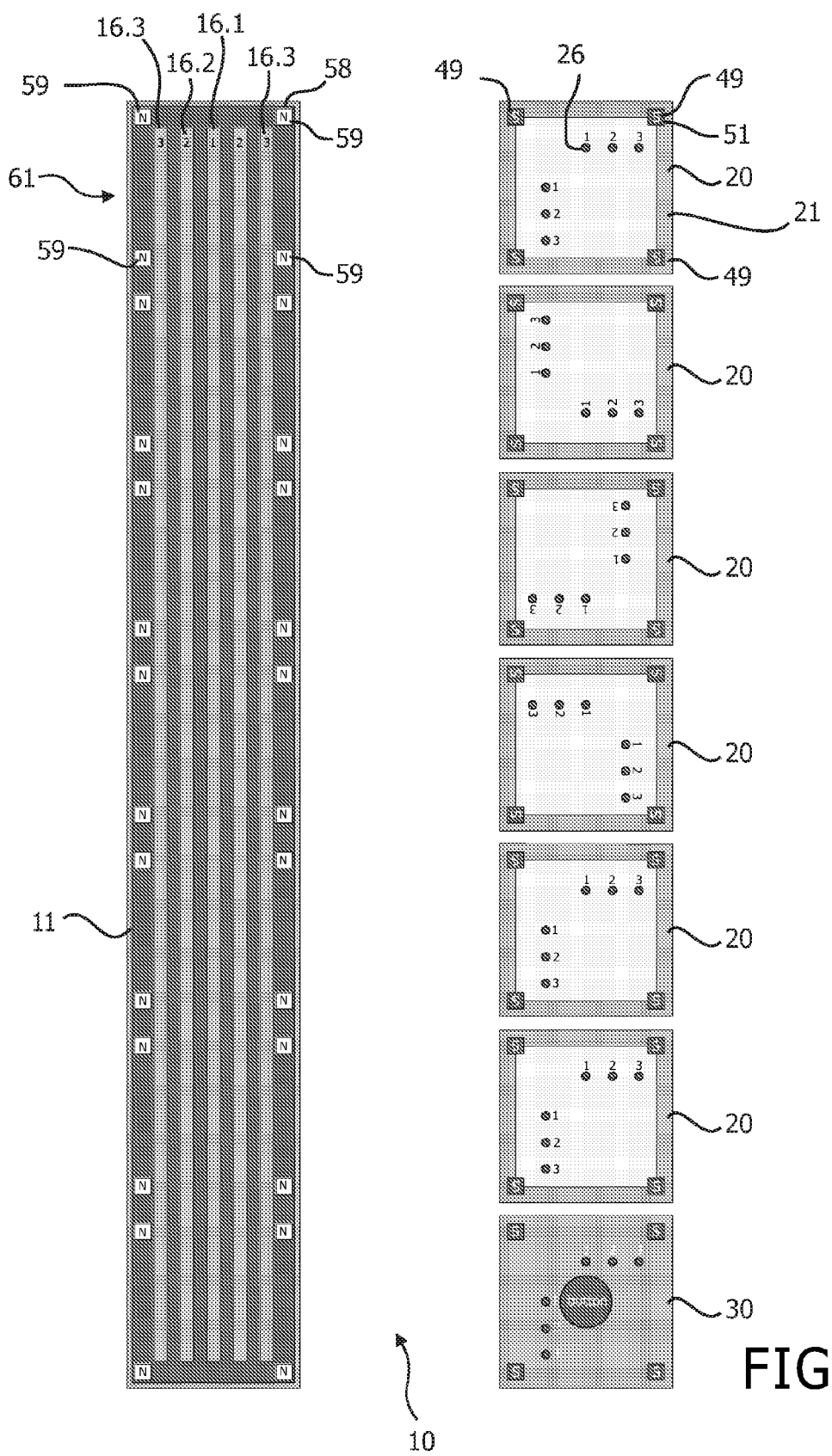
FIG. 5 is a schematic diagram of a lighting system with six light modules and one control module.

In FIG. 5, a further embodiment of a lighting system 10 is shown. The lighting system 10 comprises a base module 11, six identical light modules 20 and one control module 30. In contrast to the base module shown in FIG. 3, here five conductor lines 16 instead of three are provided as electrodes.

The embodiment shown is a scalable lighting system with rotatory proof placement of light and control modules 20, 30. The left part shows the base module 11 comprising a substrate 12 carrying five electrodes 16.1, 16.2 and 16.3. The middle electrode 16.1 is externally connected to the ground potential (GND). Its two adjacent electrodes 16.2 are internally connected to each other and externally supplied by a positive supply voltage. The two remaining outer electrodes 16.3 are data line electrodes.

On the right hand side, plural identically structured light modules 20 and a control module 30 are shown. The control module 30 comprises six pin-shaped electrode connector elements 26. Depending on the displacement angle of the control module 30 on the substrate 12, three of these electrode connector elements 26 are connected to the electrodes 16 of the base module if placed on it. Element 1 will be connected to GND and element 2 will be connected to the positive supply voltage.

The control module generates a reference signal or control signal, which is transmitted to the outer two electrodes of the base module via element 3 of the control module. The signal can be adjusted by rotating the rotary switch 35 that allows to dim the light modules 20. If placed on the base module, the electrode connector elements 26 of the other six light modules shown in FIG. 5 will be connected to ground, to the supply voltage and to the reference signal, respectively. The potentials applied to the three electrodes 16.1 to 16.3 are sent to the controller of the light modules 20 which control the current through the light element, for example an OLED.

In FIG. 5, the substrate 12 carries several positioning elements 58 which are provided as magnets 59. The positioning elements are arranged at the outer longitudinal areas of the substrate in a predetermined pattern depending on the design of the light and control modules used. Four magnets 59 arranged on the corners of a square form a magnet arrangement 61 defining a place or position for a light or control module 20, 30. From FIG. 5 it is apparent that the base module 11 has seven magnet arrangements 61 for the seven light or control modules 20, 30.

The positioning elements 59 serve to hold and position the light or control modules 20, 30 on the substrate 12 so that the connector elements 26 contact the proper electrodes 16 of the base module 11. In order to achieve this positioning function, each light and control module 20, 30 is provided with similarly arranged magnets 49 provided in the corners of the frame 21. The orientation of the magnets 49 of module 20, 30 is equal. Also the orientation of the magnets 59 of the arrangements 61 of the base module 11 is equal, e.g. north pole up (as indicated in FIG. 5 by "N"). Then the magnets 49 of the modules 20, 30 have their south poles on the bottom sides.

The orientation and positioning of the magnets 49, 59 causes the light or control module 20, 30 to be forced in the correct position, so that the magnets 49, 59 are aligned. As a result, the connector elements 26 properly contact the electrodes 16. Due to the provision of plural connector elements 26, the light or control modules 20, 30 may be placed on the base module in several positions each turned by 90°. However, it is not possible to place the light or control module 20, 30 between a position defined by four magnets of an arrangement. These positions are invalid or not allowed positions, whereas the positions defined by the arrangements 61 are allowed positions.

Figure 6:
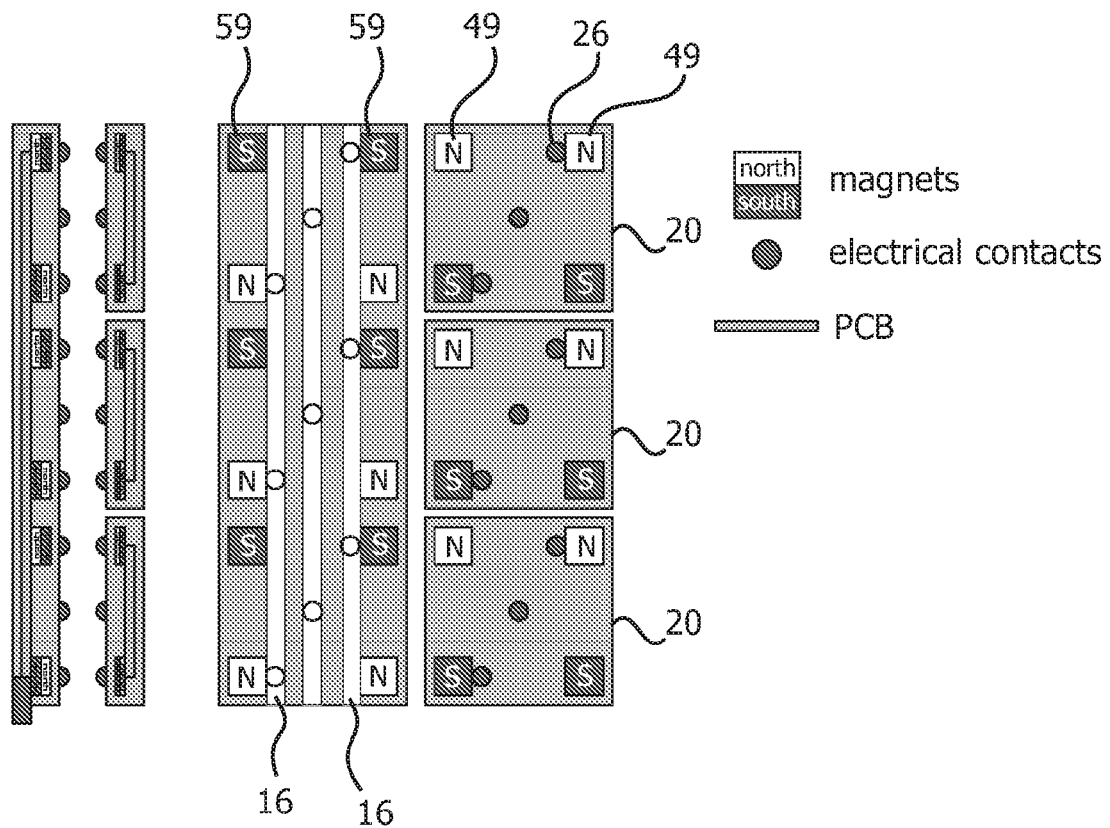
FIG. 6 is a schematic diagram of a modular system with differently oriented magnet elements.

In the case where a rotation of the light or control module must be prevented, the orientation of the magnets 49, 59 is changed as shown in FIG. 6. In this embodiment two magnets 49, 59 of each arrangement of four magnets are oriented differently. Hence, two magnets 49 have their north pole on the bottom side and two on the top side of the light or control module 20, 30. A corresponding orientation is provided for the magnets 59 of the base module.

This different orientation prevents by repelling forces of facing magnets the light or control module 20, 30 being placed on the base module in a position that is not allowed. Only one of four rotary positions of the light or control module 20, 30 is allowed and possible. In the other three rotary positions the user gets a feedback by repelling magnets that the position is not allowed or correct.

It is apparent for a person skilled in the art, that the inventive teachings may be used in modified embodiments without leaving the scope of the invention as defined in the claims. For example, it is possible to provide more or fewer than four magnets per light or control module. It is also conceivable that the base module comprises only a single magnet.

The invention claimed is:

1. Modular electric system, comprising:
   a base module comprising:
      a substrate,
      a power supply,
      means for transmitting power and/or data and
      first holding means;
   at least one load module comprising:
      an electric load,
      means for receiving power and/or data and
      second holding means,
      wherein said load module is placeable on said substrate in at least first and second positions such that said means for transmitting power and/or data interact with said means for receiving power and/or data in said first position, but not in said second position; and
   wherein said first and second holding means comprise magnet elements arranged relative to each other for removably securing said load module in said first position, but not in the second position.

2. Modular electric system of claim 1, wherein said electric load is a light unit.

3. Modular electric system of claim 1, wherein said means for transmitting power and/or data comprises at least two electrodes, and said means for receiving power and/or data comprises at least two electrode connector elements.

4. Modular electric system of claim 1, wherein said power and/or data is transmitted from the said base module and/or received by said load module wirelessly.

5. Modular electric system of claim 1, wherein said first holding means comprises at least two magnet elements with similar orientation of polarization, and said second holding means comprises at least two magnet elements with similar orientation of polarization.

6. Modular electric system of claim 1, wherein the magnet elements of said base module and said load module are oriented with respect to polarization such that in the second position at least one magnet element of said base module repels an adjacent magnet element of said load module.

7. Modular electric system of claim 1, wherein said load module comprises a substantially rectangular frame and second holding means comprises an arrangement of at least four magnet elements arranged in four corners of said frame, and said first holding means comprises at least one arrangement of at least four magnet elements disposed so as to engage said second holding means.

8. Modular electric system of claim 7, wherein said first holding means comprises a plurality of arrangements of four magnet elements distributed on the substrate.

9. Modular electric system of claim 3, wherein at least two electrodes are provided on said substrate in the form of elongated parallel conductor lines, and said load module comprises at least two electrode connector elements spaced apart according to the spacing of said conductor lines.

* * * * *